United States Patent
Zhang et al.

(10) Patent No.: US 9,913,420 B2
(45) Date of Patent: Mar. 6, 2018

(54) SYSTEM AND METHOD FOR EXTRACTING ELECTRONIC COMPONENTS

(71) Applicant: LTG Green-Tech R&D Company Limited, Road Town (VG)

(72) Inventors: Lei Zhang, Shanxi (CN); Ming-Tong Wang, New Territories (HK)

(73) Assignee: LTG Green-Tech R&D Company Limited, Tortola (VG)

( * ) Notice: Subject to any disclaimer, the term of this patent is extended or adjusted under 35 U.S.C. 154(b) by 33 days.

(21) Appl. No.: 14/418,248

(22) PCT Filed: Jan. 29, 2014

(86) PCT No.: PCT/CN2014/071800
§ 371 (c)(1),
(2) Date: Jan. 29, 2015

(87) PCT Pub. No.: WO2015/113272
PCT Pub. Date: Aug. 6, 2015

(65) Prior Publication Data
US 2015/0264847 A1  Sep. 17, 2015

(51) Int. Cl.
*H05K 13/04* (2006.01)
*B23K 3/08* (2006.01)
*B23K 1/00* (2006.01)
*B23K 1/018* (2006.01)

(52) U.S. Cl.
CPC ......... *H05K 13/0486* (2013.01); *B23K 1/018* (2013.01); *H05K 13/04* (2013.01); *B23K 3/08* (2013.01); *B23K 3/087* (2013.01); *Y10T 29/49819* (2015.01); *Y10T 29/49822* (2015.01); *Y10T 29/53274* (2015.01)

(58) Field of Classification Search
CPC .......... B23K 3/08; B23K 1/018; B23K 3/087; H05K 13/0486; Y10T 29/49819; Y10T 29/53274; Y10T 29/49822
USPC ................ 228/119, 191, 264, 13, 19, 20, 50
See application file for complete search history.

(56) References Cited

U.S. PATENT DOCUMENTS

| | | | | |
|---|---|---|---|---|
| 5,148,969 A | * | 9/1992 | Boucher | ............... B23K 1/0053 |
| | | | | 156/750 |
| 5,715,592 A | * | 2/1998 | Mori | ................... H05K 13/0486 |
| | | | | 228/191 |
| 5,758,817 A | * | 6/1998 | Chapman | ........... H05K 13/0486 |
| | | | | 228/19 |

FOREIGN PATENT DOCUMENTS

CN    204195009 U  *  3/2015

OTHER PUBLICATIONS

Text document CN 204195009 U is attached.*
Machine translation CN 204195009 U is attached.*
Pdf of original document CN 204195009 U is attached.*

* cited by examiner

*Primary Examiner* — Peter DungBa Vo
*Assistant Examiner* — John S Lowe
(74) *Attorney, Agent, or Firm* — Renner Kenner Greive Bobak Taylor & Weber

(57) ABSTRACT

A method for extracting electronic components comprising the steps of heating an electronic device having one or more electronic components by delivering heat energy to the electronic device directly to a first side surface or a second side surface of the electronic device and disturbing the electronic device to separate the one or more electronic components from the electronic device.

22 Claims, 7 Drawing Sheets

SYSTEM AND METHOD FOR EXTRACTING ELECTRONIC COMPONENTS

CROSS-REFERENCE TO RELATED APPLICATIONS

This application is a National Phase filing of PCT application number PCT/CN2014/071800, filed Jan. 29, 2014, which is incorporated herein by reference.

TECHNICAL FIELD

The present invention relates to a system and method for extracting electronic components and particularly, although not exclusively, to a system and method for extracting electronic components from an electronic device such as a printed circuit board.

BACKGROUND

Modern electronic devices such as computers, mobile phones and electronic control circuits contain various electronic components and circuitry which may be of specific value. Often when an electronic device such as a computer or Smartphone is no longer in operational condition, the electronic components used within the device may still be perfectly functional as certain electronic components can often outlast the life of the device itself.

As an example, certain electronic components such as central processing units (CPU), memory chips, programmable arrays, graphic processors, program counters or any other electronic components or integrated circuits may be considered more valuable than other components which are used in an electronic device. Accordingly, should an electronic device such as a control board of a smart phone or computer become redundant or partially damaged, it may well be that some of these electronic components on the control board of the device can be reused in other devices.

However, due to the manner in which these components are usually used in the manufacturing of an electronic device, it may be difficult to extract any individual components. In modern electronic devices, electronic components are usually bonded onto an electronic device, such as a control board, with the intention that the electronic component will not be removed from the board. This makes it difficult and costly to remove the components for reuse or recycling.

SUMMARY OF THE INVENTION

In accordance with a first aspect of the present invention, there is provided a method for extracting electronic components comprising the steps of:

heating an electronic device having one or more electronic components by delivering heat energy to the electronic device directly to a first side surface or a second side surface of the electronic device and;

disturbing the electronic device to separate the one or more electronic components from the electronic device.

In an embodiment of the first aspect, the first side surface is a top planar surface of the electronic device and the second side surface is a bottom planar surface of the electronic device.

In an embodiment of the first aspect, the method further comprises the step of continuously delivering heat energy to the electronic device when the electronic device is continuously disturbed.

In an embodiment of the first aspect, the electronic device is continuously disturbed by a hammer arrangement arranged to continuously apply physical force to the electronic device so as to vibrate the electronic device to loosen the one or more electronic components of the electronic device.

In an embodiment of the first aspect, the delivery of heat energy to the electronic device is controlled with a heating strategy associated with attributes of an adhesive used in the electronic device.

In an embodiment of the first aspect, the hammer arrangement includes an elongated hammer member arranged to rotate to continuously disturb the electronic device.

In an embodiment of the first aspect, the method further comprises a step of stacking the electronic device when the one or more electronic components disposed on the electronic device are substantially removed.

In an embodiment of the first aspect, the electronic components extracted from the electronic device are removed by a conveyor arrangement.

In an embodiment of the first aspect, the electronic device is substantially planar.

In an embodiment of the first aspect, the electronic device is a printed circuit board.

In accordance with a second aspect of the present invention, there is provided a system for extracting electronic components comprising:

a heating chamber arranged to heat an electronic device having one or more electronic components by delivering heat energy to the electronic device directly to a first side surface or a second side surface and;

a hammer arrangement arranged to disturb the electronic device so as to separate the one or more electronic components from the electronic device.

In an embodiment of the second aspect, the first side surface is a top planar surface of the electronic device and the second side surface is a bottom planar surface of the electronic device.

In an embodiment of the second aspect, the heating chamber is arranged to continuously deliver heat energy to the electronic device when the electronic device is continuously disturbed.

In an embodiment of the second aspect, the hammer arrangement is arranged to continuously apply physical force to the electronic device so as to vibrate the electronic device to loosen the one or more electronic components of the electronic device.

In an embodiment of the second aspect, the delivery of heat energy to the electronic device is controlled with a heating strategy associated with attributes of an adhesive used in the electronic device.

In an embodiment of the second aspect, the hammer arrangement includes an elongated hammer member arranged to rotate to continuously disturb the electronic device.

In an embodiment of the second aspect, the system further comprises a step of stacking the electronic device when the one or more electronic components of the electronic device are substantially removed.

In an embodiment of the second aspect, the electronic components extracted from the electronic device are removed by a conveyor arrangement.

In an embodiment of the second aspect, the electronic device is substantially planar.

In an embodiment of the second aspect, the electronic device is a printed circuit board.

In an embodiment of the second aspect, the printed circuit board is delivered to the heating chamber by use of a conveyor device arranged to transport the printed circuit board into the heating chamber for heating.

In an embodiment of the second aspect, the conveyor device is arranged to further transport the printed circuit board to the hammer arrangement for physical disturbance.

In an embodiment of the second aspect, the conveyor device includes a height adjustable arrangement arranged to adjust a vertical displacement of the printed circuit board when it is transported into the heating chamber.

In an embodiment of the second aspect, the heating chamber includes a heating array having a plurality of heating elements.

In an embodiment of the second aspect, the plurality of heating elements are each individually controllable.

In an embodiment of the second aspect, the plurality of heating elements are arranged to deliver heat to at least two sides of the electronic device.

In an embodiment of the second aspect, the heating chamber is heated to a temperature of 180 degrees to 220 degrees Celsius.

In an embodiment of the second aspect, the heat delivered to the electronic device is arranged to substantially surround the electronic device.

In an embodiment of the second aspect, the electronic device is disturbed by the hammer arrangement when the electronic device is heated.

In an embodiment of the second aspect, the hammer arrangement is further arranged to continuously disturb the electronic device for a predetermined period of time.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Figure 1:
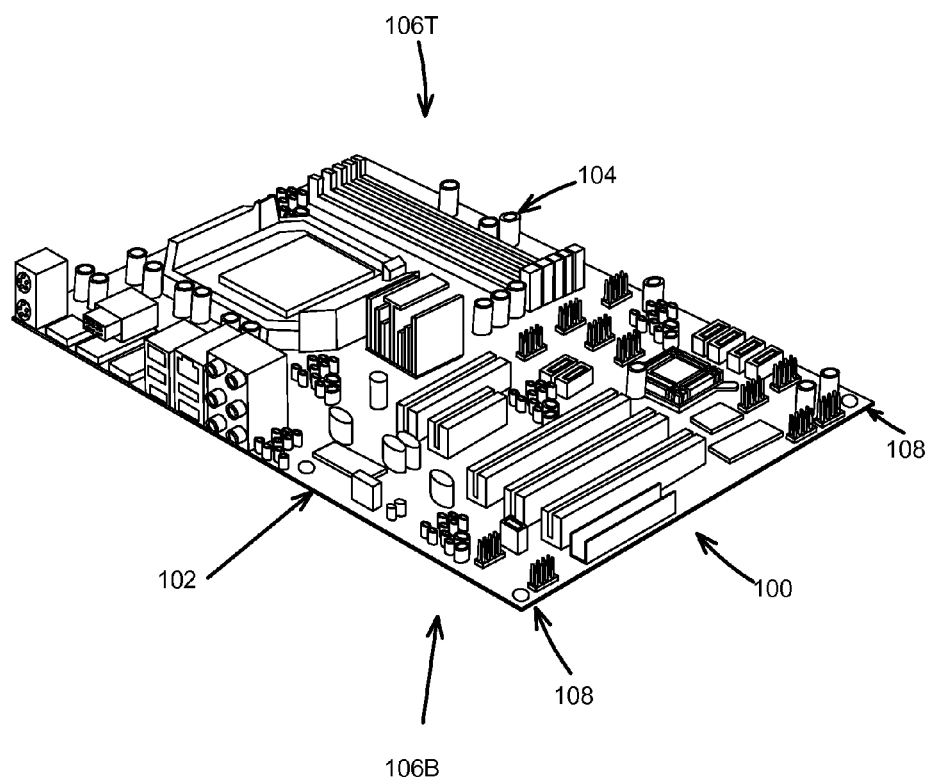
FIG. 1 is an illustration of an electronic device having one or more electronic components which may be processed by a system for extracting electronic components in accordance with one embodiment of the present invention.

With reference to FIG. 1, there is illustrated an embodiment of an electronic device 100 having one or more electronic components 104 which may be suitable for extraction by a system for extracting electronic components in accordance with one embodiment of the present invention. In this embodiment, the electronic device 100 is a printed circuit board (PCB) 102 which may have one or more electronic components 104 disposed thereon. These electronic components 104 may include integrated circuits, chips, transient components, resistors, motors, relays or any component which is arranged to provide a function under an electrical load, electrical signal or electronic signal. The term electronic component 104 may also include components which are non-electronic in nature but may operate with or incidental to an electrical or electronic device. This would include sockets, switches, fasteners, insulators, cables, chip engagement means, conductors, heat shields, heat-sinks, coolers or the like.

In this embodiment, the printed circuit board 100 is a computer mother board or main board which may be found in various computing devices. As shown in this example, the printed circuit board (PCB) may be a circuit board 102 which has various electronic components 104 bonded to conductive tracks to form electronic circuits. These electronic components 104 may include, without limitations:

Integrated Circuits (IC) which may sometimes be referred to as computer chips or chips and may include CPUs, memory, program counter, programmable arrays or graphical processors;

Electronic or electrical components such as capacitors, resisters, Light emitting diodes (LEDs), motors, and other electronic components; and Various other components such as sockets, hinges, springs, fasteners, battery holders, heat sinks, supporting plates or engagement members which can be used to engage with other electronic components.

These electronic components 104 may be disposed on the PCB 102 to perform a specific function when electricity or a signal is supplied to the components. As the electronic components 104 may be in contact with a conducting track on the PCB so as to allow electricity or signals to be communicated by each of the components, an adhesive, such as solder, may be used to bond the components 104 to the PCB 102.

As shown in this example embodiment, the printed circuit board 100 is substantially planar in shape and may include a top side of the printed circuit board 106T which faces upwards when the printed circuit board is in use and a bottom side 106B which may be mounted against a wall of a computer or device housing. The printed circuit board may also have one or more apertures 108 drilled into the printed circuit board surface so as to allow a fastener, such as a screw or a bolt, to be used to secure the board into a housing. As a person skilled in the art would appreciate, a PCB can be of various sizes or shape and may be used as a mother board, graphics card, sound card, control board or any other types of electronic devices.

Figure 2:
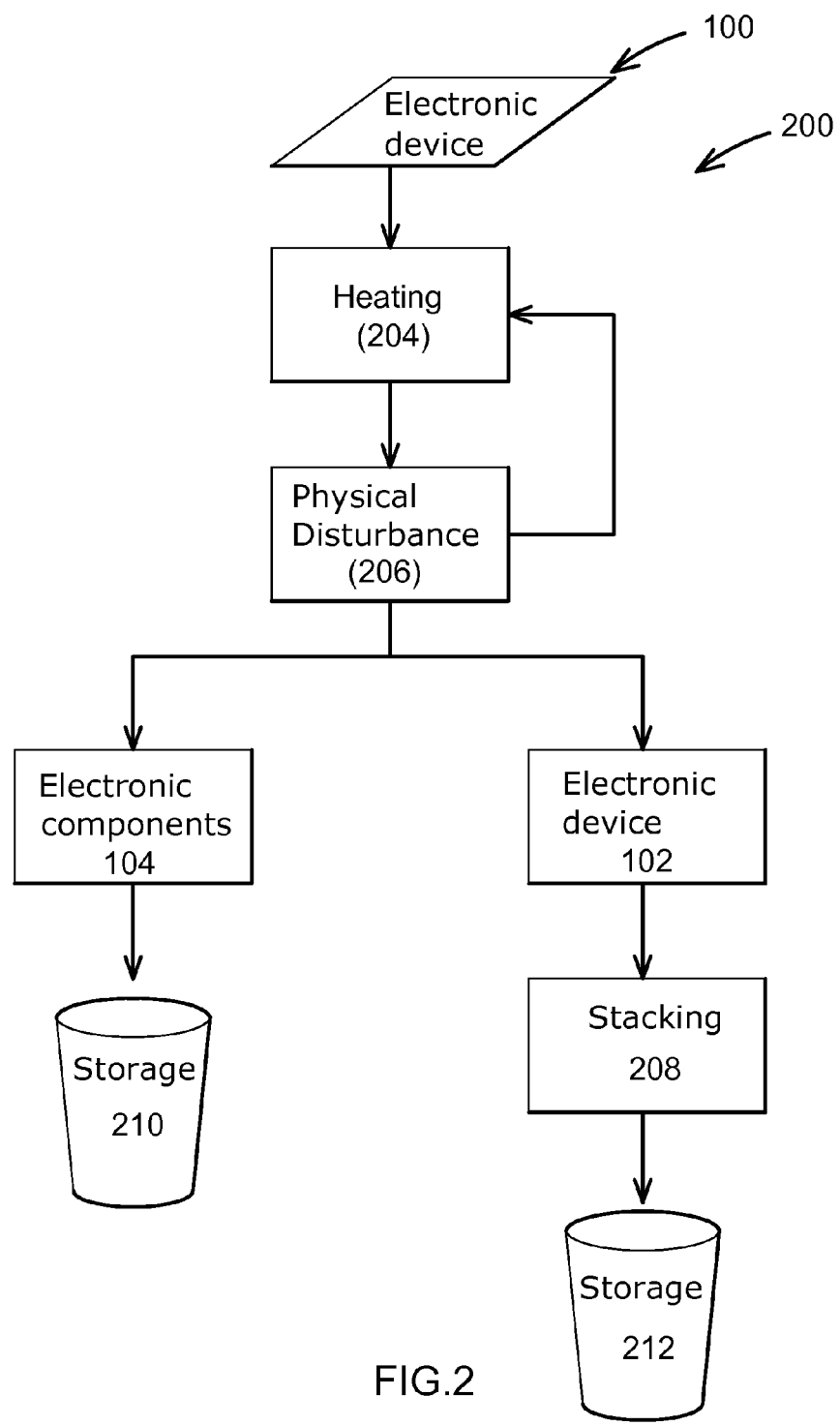
FIG. 2 is a flow diagram which illustrates the individual steps performed by a system for extracting electronic components from an electronic device as illustrated in FIG. 1.

With reference to FIG. 2, there is provided a flow diagram which illustrates the individual procedures of a method for extracting electronic components 200 comprising the steps of: heating an electronic device 100 having one or more electronic components by delivering heat energy to the electronic device directly to a first side surface or a second side surface (204) and; disturbing the electronic device (206) to separate the one or more electronic components 104 from the electronic device 100.

In this embodiment, an electronic device 100, such as a printed circuit board as shown in FIG. 1 may be processed by the procedures as listed in FIG. 2 such that one or more electronic components 104 disposed on the circuit board can be substantially separated from the printed circuit board 102 itself. Such an arrangement is advantageous in that it allows the one or more electronic components 104 or the circuit board 102 with one or more electronic components 104 removed, to be reused or recycled.

Initially, a printed circuit board 100 having one or more electronic components 104 is firstly subjected to heating whereby heat energy is delivered to the surfaces of the printed circuit board (204). Preferably, the circuit board 100 is heated to a predetermined temperature for a predetermined period of time. Depending on the dimensions and layout of the printed circuit board 100 and the composition of the adhesives which are used to bond the electronic components to the printed circuit board, the predetermined temperature may be approximately 182 to 183 degrees Celsius for certain types of printed circuit boards 100 which uses a solder alloy made from Tin and Lead (such as Sn63Pb37 solder which has a composition of 63% tin and 37% lead). In examples where the printed circuit board 100 is Restriction of Hazardous Substance (RoHS) compliant, the solder may be lead free or uses substantially less lead in which case the predetermined temperature may be higher at approximately 200 to 220 degrees. Preferably, the purpose of applying the heat to the printed circuit board 100 is to substantially melt or at least soften the solder which is used to weld (or solder) the electronic components 104 on to the printed circuit board and thus allowing for the electronic components 104 to be freed or substantially loosened from the bonding effects of the solder between the components and the board itself. In turn, this allows the components to be removed from the printed circuit board.

Once an amount of heat energy is delivered to the printed circuit board 100 so as to soften or partially melt the solder, each individual printed circuit board 100 may then be physically disturbed so that the electronic components on the printed circuit board can be loosened and removed from the printed circuit board, although in some embodiments, the physical disturbance of the printed circuit board 100 can take place at any time once the board is undergoing processing.

In one embodiment, the physical disturbance can be delivered by using a vibrating surface to exert vibrations onto the printed circuit board. This may be achieved by placing a vibrating member in physical contact with the printed circuit board and in turn, have the vibrating member vibrate in a manner such that individual electronic components disposed on the board is loosened, separated and dropped on to a moving conveying belt arranged to deliver the electronic components to a separate location. Preferably, a hammer arrangement 304 (or 600 with reference to FIG. 6), which may include a plurality of rotating hammer members 602 are arranged to rotate and on each rotation, hit the printed circuit board 100 or cause a sufficient amount of physical vibration along the printed circuit board 100 so that loosened components or components which are loosened due to the melting or softening of solder can be effectively removed from the board.

Figure 3:
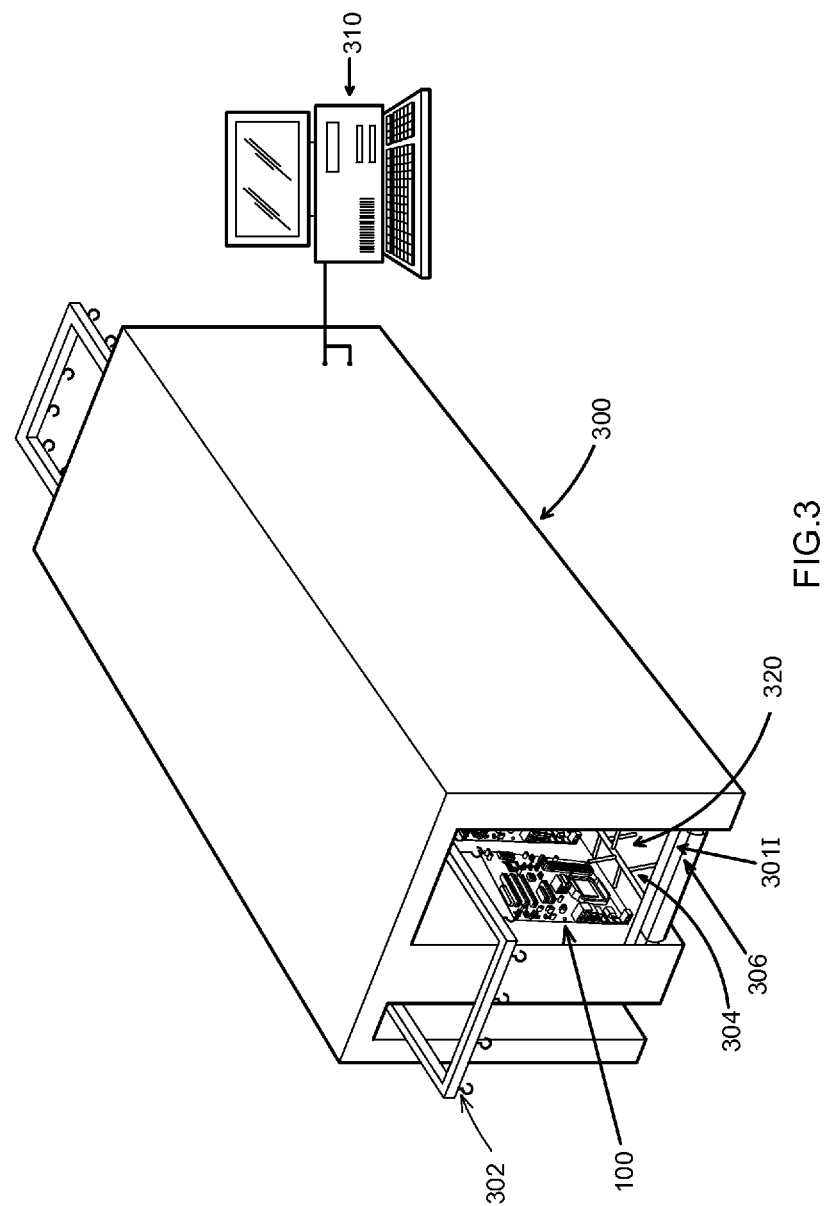
FIG. 3 is a perspective view of a system for extracting electronic components in accordance with one embodiment of the present invention.
Figure 4:
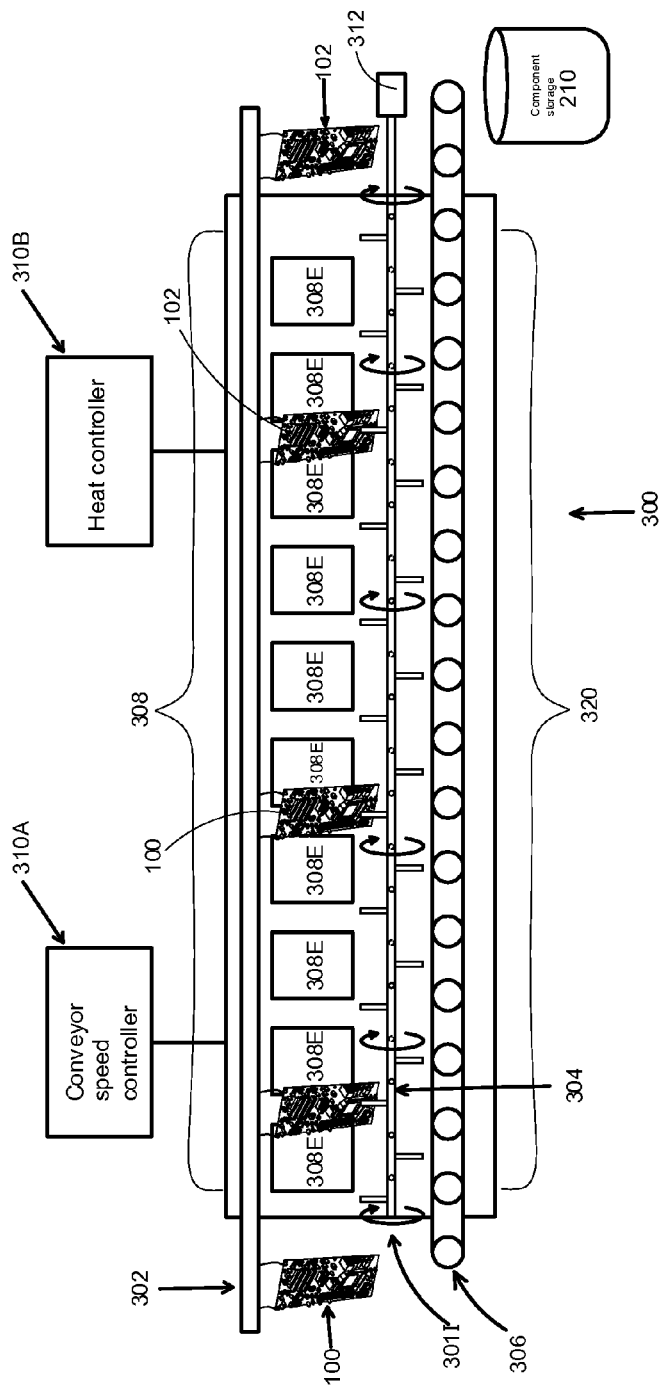
FIG. 4 is a side cutaway view of the system for extracting electronic components as shown in FIG. 3.
Figure 5:
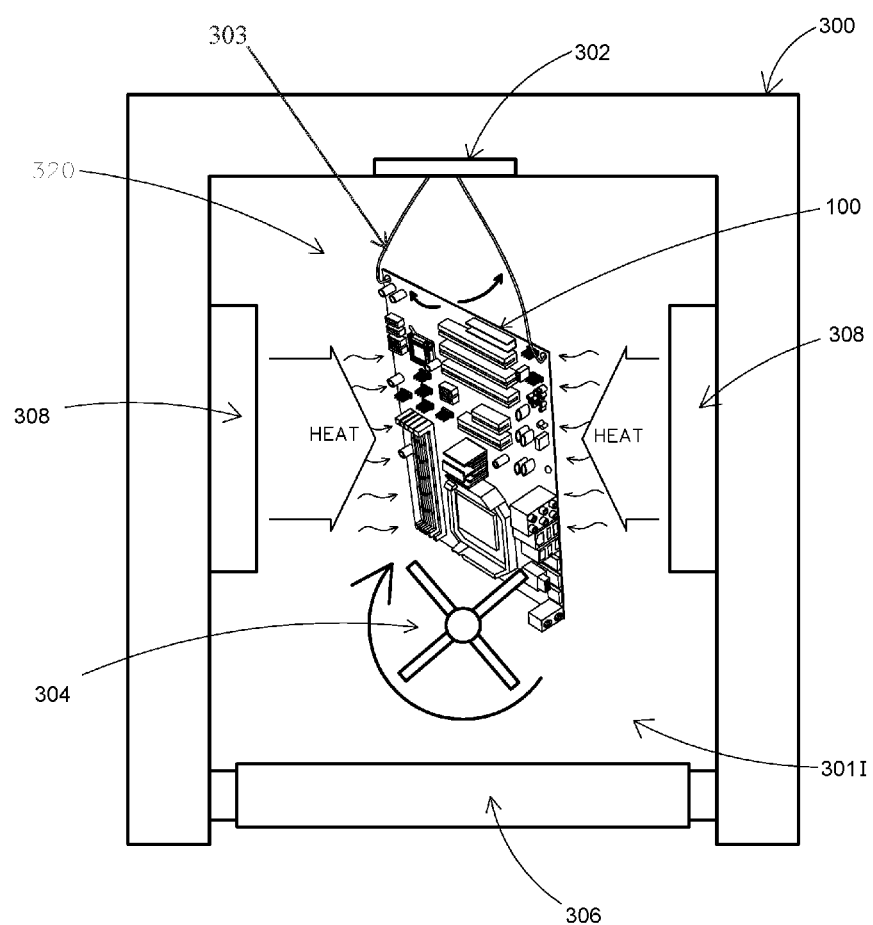
FIG. 5 is a front view of the system for extracting electronic components as shown in FIG. 3.

In some examples where integrated circuits (ICs) are bonded to the printed circuit board 100 by use of a ball array grid (BAG) method, the initial heat delivery may substantially melt the ball array grid (BAG) which is used to bond the integrated circuit to the printed circuit board 100. Once the BAG has substantially melted, the contact with the hammers 602 would physically disturb the printed circuit board 100 and thus allow the integrated circuit to be loosened and separated from the printed circuit board 100. These separated integrated circuits or any other electronic components 104 can then be retained by a catcher and delivered by conveyor belt to a separate location for storage 210 or further processing. Preferably, the heating and the physical disturbance of each of the printed circuit boards 100 is a continuous process and may be performed simultaneously and continuously for a predetermined period of time when the printed circuit board 100 is being processed by the system 300. As illustrated in FIGS. 3, 4 and 5, the system for extracting electric component 300 may comprise a heating chamber 320 arranged to heat an electronic device 100 having one or more electronic components 104 by delivering heat energy to the electronic device 100 directly to a first side surface or a second side surface and; a hammer arrangement 304 arranged to disturb the electronic device 100 so as to separate the one or more electronic components 104 from the electronic device 100.

In this embodiment, the system 300 is arranged to receive a printed circuit board 100 for processing at an input end 301I whereby the printed circuit board 100 is hung on a conveyor arrangement 302 so that it is arranged to travel through a set distance within a heating chamber 320 of the system 300. Once the printed circuit board 100 has entered the heating chamber 302, the printed circuit board 100 is then exposed to a continuously delivery of heating energy whilst it is physically disturbed for the duration of the printed circuit board 100 being inside the heating chamber 320 of the system 300. The duration of the printed circuit board 100 being inside the heating chamber 320 can be controlled by adjusting the speed of the conveyor system 302 by setting a predetermined period of time in which the printed circuit board 100 is expected to be heated and physically disturbed so as to separate the components 104 disposed on the printed circuit board 100.

These embodiments are advantageous in that certain electronic components 104 may not readily be separated from the circuit board 100 on the initial first heating and physical disturbance cycle but will ultimately be loosen as it travels further into the heating chamber 320 of the system. By controlling the duration of which the printed circuit board 100 is allowed to travel within the heating chamber 320, a user can adjust the amount of heat energy or physical disturbance a printed circuit board 100 may be subjected to during its processing. This in turn allows a user to determine how many components 104 on the printed circuit board 100 are to be removed from the board. As a person skilled in the art would appreciate, if the user wishes to only remove a number of critical components, such as a graphics processor or central processing unit which is bonded to the board with a BAG method, then the heat and disturbance level can be set so as to only separate these components 104. This may in turn mean certain components such as memory or battery sockets may remain on the printed circuit board as these may have a stronger bond with the printed circuit board and requires a higher heat or longer processing time to separate from the board.

As shown in FIGS. 3, 4 and 5, the system includes a heating chamber 320 which is arranged to deliver heat to an electronic device 100, such as a printed circuit board. In this embodiment, the system 300 firstly operates by allowing a printed circuit board 100 to be hung from a moving conveying arrangement 302 such that the planar sides of the circuit board 106T, 106B (the top and bottom surface of the printed circuit board 100 is directly exposed to heating elements 308E within the heating chamber 320. Preferably, the system 300 includes a plurality of heating element 308E to form a heater array 308. These heating elements 308E, as shown in this example, are disposed on both sides of the heating chamber 320 and deliver heating energy so as to heat the top 106T and bottom 106B surfaces of a printed circuit board 100. By positioning the heating elements 308E on both sidewalls of the chamber 320, both the top and planar bottom face 106T, 106B of a printed circuit board 100 undergoing processing by the system 300 is directly exposed to a heating element 308E and thus allowing for a more effective delivery of heat energy to the printed circuit board's surfaces.

In operation, the printed circuit board 100 is firstly hung on a conveyor arrangement 302 such that the PCB can be made to travel through the heating chamber 320. Preferably, one or more elongated hook members 303 can be used to hold each PCB through any apertures 108 already present on the PCB such that the planar surfaces of the PCB are exposed directly to the heating elements within the heat chamber 320, although the hook members may also include a clamp to grasp onto any electronic device which does not have any suitable apertures. Depending on the size of the PCB, the elongated hook members may be sized accordingly such that the PCB can be exposed to the heating elements within the heating chamber 320 whilst also being of sufficient reach to come into contact with the hammer arrangement 302 which may be, as shown in this example, disposed near the bottom of the heating chamber 320. Alternatively, the conveyor arrangement 302 may also be height adjustable so as to facilitate a similar function.

Once the printed circuit board 100 is positioned correctly on the conveyor arrangement 302, it is then transported through the heating chamber 320. As the printed circuit board 100 enters the heating chamber 320, the heater array 308 applies heat energy to the surfaces of the printed circuit board 308E so as to melt or soften the solder which bonds the components to the printed circuit board 100. Simultaneously, a number of hammer arrangements 304 are also arranged to physical disturb each of the printed circuit boards 100. By applying this physical disturbance to the board 100, the physical vibration forces applied onto each printed circuit board 100 would loosen any electronic components 104 which have been soldered onto the printed circuit board 100. Once the components 104 are loosened and separated, the components will fall by gravity onto a moving conveying belt 306 below arranged to deliver the electronic components 104 away from the printed circuit boards 100 and into a storage container 210 for further processing, sorting or storage.

Figure 4A:
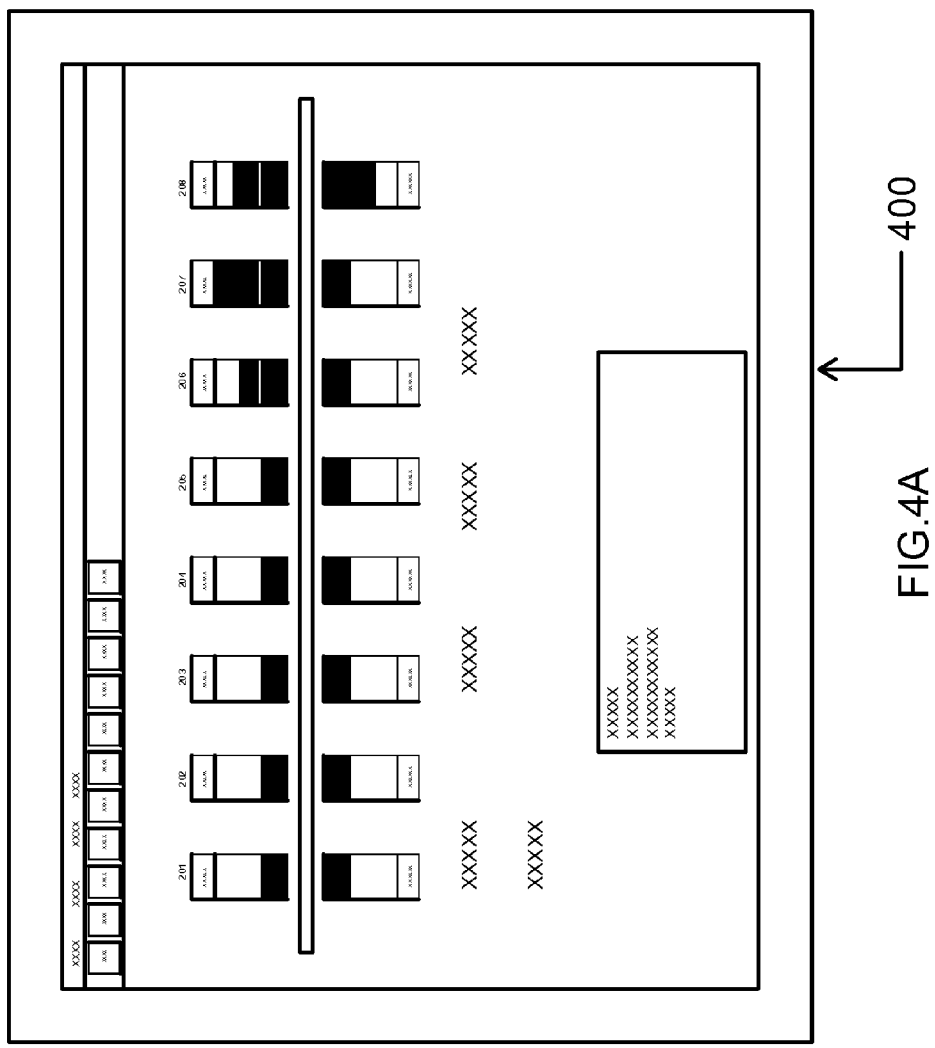
FIG. 4A is a screenshot of an interface of a controller arranged to control the heating array of the system of FIG. 3.

As shown in FIG. 4, a printed circuit board 100 will travel through this heater array 308 for a predetermined period of time depending on the speed of the conveyor arrangement 302. Depending on the period of time intended by a user to process the PCB, the speed of the conveyor arrangement 320 can be set by a controller 310A. Simultaneously, the heater elements 308E which is arranged to control the heat energy delivered by each of the heating elements 308E onto the printed circuit boards 100 can also be controlled by a controller 310B, such as a computerized controlling system having an interface 400 as shown in FIG. 4A. In this example, a computer controller may execute a processing strategy which includes a heating strategy based on the layout, size, solder type, component type or any other attributes of the printed circuit board or any other electronic device. By using such a strategy, an optimal amount of heat energy can be delivered to each unique printed circuit board 100 to achieve a desirable result of separating the components from the board.

Depending on the requirements of a user, in some embodiments, the heating elements 308E of the heating array 308 are arranged to operate together so as to deliver an optimal level of heat energy to the electronic device 100 as it is transported through the chamber 320. In one example, the heat energy initially delivered to an electronic device 100 under process is fairly weak but soon increases in intensity as the printed circuit board 100 travels through the heater array 308. This is particularly advantageous in that by applying a steady amount of heat to the printed circuit board 100, the possibility of damaging the electronic components 104 are minimized due to a steady change in temperature and thus where the components are intended to be reused, there is a lesser chance that the components will be rendered faulty in view of the separation process.

As the printed circuit board 100 travels through the heater array 308, it is constantly being physical disturbed by the hammer arrangement 304, either immediately as the PCB enters the heating chamber 320, or during or after the PCB 100 has been heated. In turn, as the adhesives (solder) which bonds the components to the printed circuit board starts to soften or melt due to the printed circuit board reaching a temperature whereby the adhesives will melt, the components 104 are loosen from the vibration and shaking which the printed circuit board is subjected to from the hammer arrangement 304.

Upon the completion of the process, the printed circuit board 102 will exit the heating chamber with a substantial portion or desired number of the electronic components 104 disposed thereon having been removed through the extraction process described in various examples above. This allows the printed circuit board 102 to be stacked (208) into a stack arrangement for storage 212 or recycling whilst the electronic components 104 which have been separated as the PCB traveled through the heating chamber 320 may be collected, sorted and recycled.

With reference to FIG. 5 which illustrates a front view of the system 300, the system 300 has a heating chamber 320 that is arranged to heat the top 106T and bottom 106B sides of the printer circuit board 100. Preferably, the chamber is also arranged so as to allow the heat energy to be delivered directly from both sides of the printed circuit board 100 such that when the printed circuit board is orientated to enter the heating chamber 320 of the system 300, the printed circuit board 100 enters the chamber 320 sideways such that both the top 106T and bottom 106B surfaces of the printed circuit board 100 is directly exposed to a heater element 308E. In turn, this increases the amount of heat which is then delivered to the surfaces of the printed circuit board 100. This is advantageous in that the heat is more effectively delivered to the entire surfaces of the printed circuit board 100 and thus allows the solder used to engage and secure the electronic components to the printed circuit board to be more easily softened or melted away.

Advantageously, by delivering the heat from both sides to the top and bottom surfaces of the printed circuit board there is provided a more effective manner in which the printed circuit board can be heated and thus the overall size of the system, including the length of the heater array, can be reduced when compared to other embodiments whereby the heat is not directly delivered to the printed circuit board.

Figure 6:
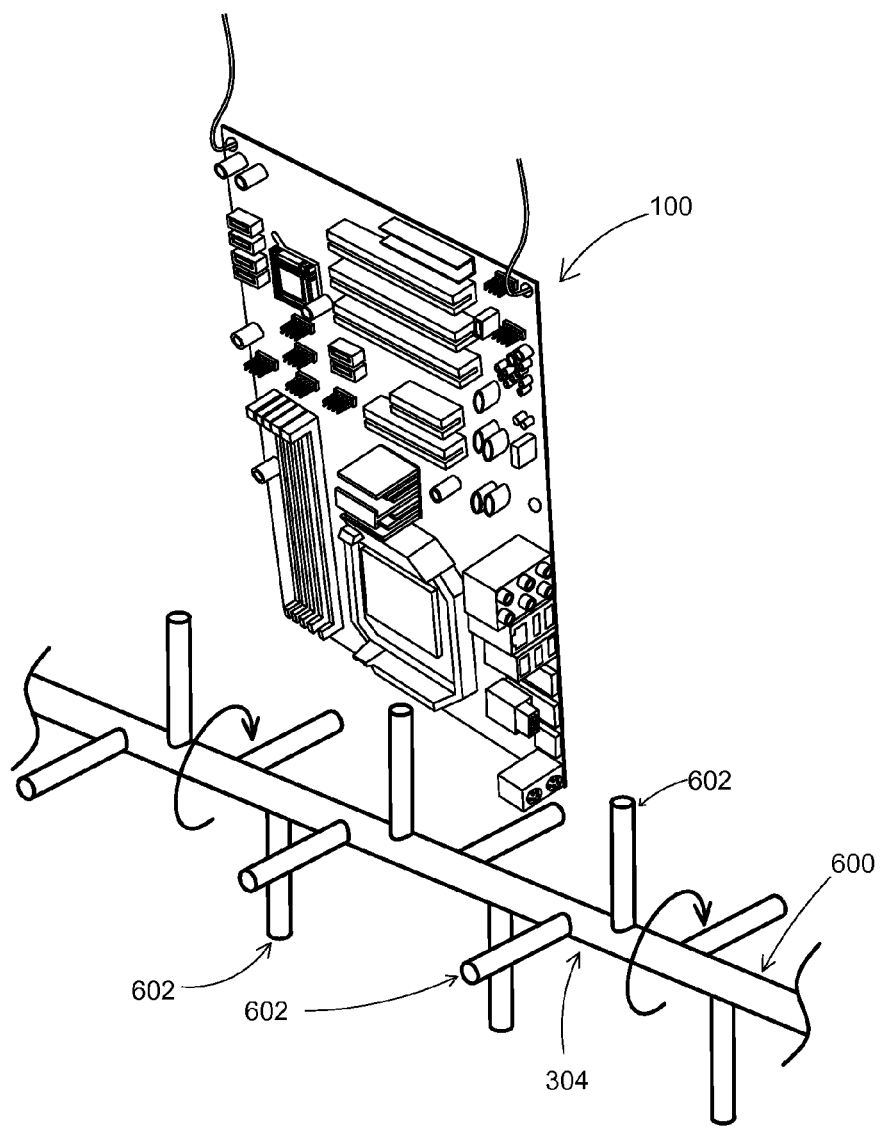
FIG. 6 is an illustration of an embodiment of a hammer arrangement for use in a system for extracting electronic components of FIG. 3.

With reference to FIG. 6, there is illustrated an embodiment of a hammer arrangement 304 which is shown in this embodiment is an elongated member 600 having a plurality of protrusions 602 each arranged to act as a hammer to physically hit a printed circuit board 100 travelling through the system 300. The hammer arrangement 304 is arranged to be rotated by a motor 312 with its rotational speed being controlled by a controller such that electronic components 104 disposed on the board 100 can be physically disturbed in such a manner that the electronic components will be vibrated and knocked out of position without excessive damage to the printed circuit board.

Preferably, the hammer arrangement 304 is arranged to extend the length of the system 300 although as a person skilled in the art would appreciate, the hammer arrangement 304 can also be of limited length such that the physical disturbance does not occur until sometime after the printed circuit board has travelled through the heater array in the system and thus reach a minimum temperature.

Although the electronic device described in the examples above relates to printed circuit boards, the term electronic device will include other devices. It may be that whole electronic devices in any shape or configuration, or even mechanical devices in any shape or configuration can be processed by the system 300 to extract one or more components.

It will also be appreciated that where the methods and systems of the present invention are either wholly implemented by computing system or partly implemented by computing systems then any appropriate computing system architecture may be utilised. This will include stand alone computers, network computers and dedicated hardware devices. Where the terms "computing system" and "computing device" are used, these terms are intended to cover any appropriate arrangement of computer hardware capable of implementing the function described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A system for extracting electronic components comprising:
   a heating chamber heating an electronic device having one or more electronic components by delivering heat energy to the electronic device directly to a first side surface and a second side surface of the electronic device;
   at least one hook member hanging the electronic device on a conveyor device, such that the electronic device travels through a distance within the heating chamber;
   a hammer arrangement continuously disturbing the electronic device so as to separate the one or more electronic components from the electronic device; and
   a conveying arrangement collecting and delivering the one or more electronic components separated from the electronic device; wherein the electronic device enters the heating chamber sideways such that both the first side surface and a second side surface are directly exposed to a plurality of heating elements disposed on both sides of the heating chamber, and the heat delivered to the electronic device is arranged to substantially surround the electronic device; wherein the plurality of heating elements continuously deliver heat energy to the electronic device when the electronic device is continuously disturbed by the hammer arrangement; and, when the one or more electronic components are separated from the electronic device by the hammering arrangement, the one or more electronic components fall by gravity onto the conveying arrangement.

2. A system for extracting electronic component in accordance with claim 1, wherein the first side surface is a top planar surface of the electronic device and the second side surface is a bottom planar surface of the electronic device.

3. A system for extracting electronic components in accordance with claim 2, wherein the heating chamber is arranged to continuously deliver heat energy to the electronic device when the electronic device is continuously disturbed.

4. A system for extracting electronic components in accordance with claim 3, wherein the hammer arrangement is arranged to continuously apply physical force to the electronic device so as to vibrate the electronic device to loosen the one or more electronic components of the electronic device.

5. A system for extracting electronic components in accordance with claim 1, wherein the delivery of heat energy to the electronic device is controlled with a heating strategy associated with attributes of an adhesive used in the electronic device.

6. A system for extracting electronic components in accordance with claim 4, wherein the hammer arrangement includes an elongated hammer member arranged to rotate to continuously disturb the electronic device.

7. A system for extracting electronic components in accordance with claim 1 further comprising a step of stacking the electronic device when the one or more electronic components of the electronic device are substantially removed.

8. A system for extracting electronic components in accordance with claim 1, wherein the electronic components extracted from the electronic device are removed by a conveyor arrangement.

9. A system for extracting electronic components in accordance with claim 1, wherein the electronic device is substantially planar.

10. A system for extracting electronic components in accordance with claim 9, wherein the electronic device is a printed circuit board.

11. A system for extracting electronic components in accordance with claim 10, wherein the printed circuit board is delivered to the heating chamber by use of a conveyor device arranged to transport the printed circuit board into the heating chamber for heating.

12. A system for extracting electronic components in accordance with claim 11, wherein the conveyor device is arranged to further transport the printed circuit board to the hammer arrangement for physical disturbance.

13. A system for extracting electronic components in accordance with claim 12, wherein the conveyor device includes a height adjustable arrangement arranged to adjust a vertical displacement of the printed circuit board when it is transported into the heating chamber.

14. A system for extracting electronic components in accordance with claim 1, wherein the heating chamber includes a heating array having a plurality of heating elements.

15. A system for extracting electronic components in accordance with 14, wherein the plurality of heating elements are each individually controllable.

16. A system for extracting electronic components in accordance with claim 14, wherein the plurality of heating elements are arranged to deliver heat to at least two sides of the electronic device.

17. A system for extracting electronic components in accordance with claim 1, wherein the heating chamber is heated to a temperature of 180 degrees to 220 degrees Celsius.

18. A system for extracting electronic components in accordance with claim 1, wherein the electronic device is disturbed by the hammer arrangement when the electronic device is heated.

19. A system for extracting electronic components in accordance with claim 1, wherein the hammer arrangement is further arranged to continuously disturb the electronic device for a predetermined period of time.

20. A system for extracting electronic components in accordance with claim 1, wherein the at least one hook member includes at least one elongated hook member.

21. A system for extracting electronic components in accordance with claim 20, wherein the at least one hook member is arranged to hold the electronic device through at least one aperture present on the electronic device.

22. A system for extracting electronic components in accordance with claim 1, wherein the at least one hook member includes a clamp arranged to grasp the electronic device.

\* \* \* \* \*